US006362032B1

(12) United States Patent
Kim et al.

(10) Patent No.: US 6,362,032 B1
(45) Date of Patent: Mar. 26, 2002

(54) METHOD FOR MANUFACTURING FRINGE FIELD SWITCHING MODE LIQUID CRYSTAL DISPLAY

(75) Inventors: Hyang Yul Kim; Seung Hee Lee; Hyung Il Jeon, all of Kyoungki-do (KR)

(73) Assignee: Hyundai Display Technology Inc., Kyoundki-do (KR)

( * ) Notice: Subject to any disclaimer, the term of this patent is extended or adjusted under 35 U.S.C. 154(b) by 0 days.

(21) Appl. No.: 09/559,367

(22) Filed: Apr. 24, 2000

(30) Foreign Application Priority Data

Apr. 23, 1999 (KR) .............................. 99-14652

(51) Int. Cl.[7] .......................... H01L 21/00; H01L 21/84
(52) U.S. Cl. .......................................... 438/158; 438/30
(58) Field of Search ..................... 438/30, 34, 149, 438/151, 155, 158, 164, 586, 587, 608, 150

(56) References Cited

U.S. PATENT DOCUMENTS

| 5,051,800 | A | * | 9/1991 | Shoji et al. ..................... 357/30 |
| 5,182,661 | A | * | 1/1993 | Ikeda et al. ..................... 359/54 |
| 5,650,358 | A | * | 7/1997 | Gu et al. ......................... 438/30 |
| 5,879,959 | A | | 3/1999 | Chen et al. ...................... 438/30 |
| 5,953,584 | A | * | 9/1999 | Lim et al. ....................... 438/30 |
| 5,965,916 | A | * | 10/1999 | Chen ............................ 257/347 |
| 6,204,081 | B1 | * | 3/2001 | Kim et al. ....................... 438/30 |
| 6,207,480 | B1 | * | 3/2001 | Cha et al. ...................... 438/149 |

FOREIGN PATENT DOCUMENTS

JP           5-283427           10/1993

* cited by examiner

Primary Examiner—David Nelms
Assistant Examiner—Phuc T. Dang
(74) Attorney, Agent, or Firm—Ladas & Parry

(57) ABSTRACT

This invention provides a method for manufacturing a fringe field switching mode liquid crystal display. The method includes the steps of: depositing a transparent metal layer on a transparent insulating layer and forming a counter electrode by etching the transparent metal layer according to a first mask process; depositing an insulating layer on the counter electrode and the substrate; depositing a first opaque metal layer on the insulating layer and forming a gate line, a common electrode line and a pad by etching the first opaque metal layer according to a second mask process; depositing a gate insulating layer, an a-Si layer and an n+ a-Si layer in turn on a resultant and defining an active region of thin film transistor by etching the n+ a-Si layer and the a-Si layer according to a third mask process; depositing a transparent metal layer on the resultant and forming a pixel electrode of a comb shape by etching the transparent metal layer according to a fourth mask process; etching the gate insulating layer according to a fifth mask process so that the pad is exposed; forming a source electrode, a drain electrode and data line including a data pad by etching the second opaque metal layer according to a sixth mask process; and forming a passivation layer on the entire resultant and etching the passivation layer according to a seventh mask process so that the data pad is exposed.

13 Claims, 5 Drawing Sheets

METHOD FOR MANUFACTURING FRINGE FIELD SWITCHING MODE LIQUID CRYSTAL DISPLAY

BACKGROUND OF THE INVENTION

1. Field of the Invention

This invention relates to a method for manufacturing a liquid crystal display, and more particularly to a method for manufacturing a fringe field switching mode liquid crystal display capable of improving picture quality.

2. Description of the Related Art

As known in the art, the liquid crystal display (hereinafter "LCD") mainly employs TN(twisted nematic) mode and STN(super twist nematic) mode as its operation mode. However, the TN and the STN mode LCDs have narrow viewing angle characteristics. The IPS(in-plan switching) mode has been proposed to improve the shortcoming of narrow viewing angle characteristics of the TN and the STN mode LCDs. The IPS mode LCD has a structure in that as a brief description, a pixel electrode and a counter electrode both for driving liquid crystal molecules are arranged in parallel on the same substrate so that an electric field is generated in-plane to the substrate plane.

The IPS mode LCD has an advantage of wider viewing angle than the TN or the STN mode LCD. However, the IPS mode LCD has a limitation of developments in the aspect of aperture ratio and transmittance since the pixel electrode and the counter electrode are made of opaque metal.

Accordingly, a high aperture ratio and high transmittance LCD switching with a fringe field(hereinafter "FFS mode LCD") has been proposed to overcome the limits of aperture ratio and transmittance in the IPS mode LCD.

In the FFS mode LCD, a pixel electrode and a counter electrode are made of a transparent metal layer such as ITO, and the distance between those electrodes is narrower than that between upper and lower substrates. Consequently, when the FFS mode LCD is in operation, the fringe field is generated over the counter electrode and the pixel electrode thereby driving all the liquid crystal molecules existing over those electrodes. As a result, the FFS mode LCD obtains more enhanced aperture ratio and transmittance.

Hereinafter, a method for manufacturing a conventional FFS mode LCD will be discussed with reference to FIGS. 1 to 3. Herein, FIG. 1 is a cross-sectional view of a lower substrate of a thin film transistor portion in the FFS mode LCD, FIG. 2 is a cross-sectional view of a lower substrate of a pixel portion in the FFS mode LCD, and FIG. 3 is a cross-sectional view of a lower substrate of a pad portion in the FFS mode LCD.

A transparent insulating substrate 1 such as a glass substrate is provided. A transparent metal layer such as an ITO is deposited on the substrate 1, and then a counter electrode 2 is formed on the substrate 1 in shape of a comb or a plate by patterning the transparent metal layer according to a first mask process.

A first opaque metal layer is deposited on the substrate 1, and then a gate line 3, a common electrode line(not shown) and a pad 4 are formed by patterning the first opaque metal layer according to a second mask process. A gate insulating layer 5 is formed on a resultant as constructed above.

An un-doped amorphous silicon(hereinafter "a-Si") layer and an SiN layer are deposited on the gate insulating layer 5 in turn, and then an etch stopper 6 is formed by patterning the SiN layer according to a third mask process. A doped amorphous silicon(hereinafter "n+ a-Si") layer is deposited on the a-Si layer to cover the etch stopper 6, and then an ohmic contact layer 8 and a channel layer 7 are formed by patterning the n+ a-Si layer and the a-Si layer according to a fourth mask process.

A transparent metal layer such as the ITO is deposited on the resultant, and then a pixel electrode 9 is formed in shape of a comb by patterning the transparent metal layer according to a fifth mask process. Herein, when the counter electrode 2 is formed in shape of the comb, the pixel electrode 9 is disposed between the counter electrodes 2. The pad 4 is exposed by etching according to a sixth mask process the gate insulating layer portion that is disposed above the pad 4.

A second opaque metal layer is deposited on the resultant, and then a source electrode 10a, a drain electrode 10b and a data line 10 are formed by patterning the second opaque metal layer according to a seventh mask process. The data line 10 is contacted to the exposed pad 4. A passivation layer 20 made of SiN layer is deposited over the resultant, and then is patterned according to an eighth mask process so that a gate pad(not shown) and the data line portion in contact with the pad 4 is exposed.

Although not shown in the drawings, the lower substrate of the FFS mode LCD is completed by depositing a lower alignment layer on the resultant as constructed above. Afterward, the FFS mode LCD is accomplished by attaching the lower substrate an upper substrate in which an upper alignment layer is formed, with intervening a liquid crystal layer.

However, since the method for manufacturing the FFS mode LCD requires eight times of mask processes, manufacturing period and cost are increased thereby degrading productivity. That is, the mask process is a photolithography process, and the process itself includes the steps of resist-coating, exposing, developing, etching and resist-removing. Since one time of the mask process requires substantially long time, the eight times of mask processes require more time and cost. Accordingly, the foregoing conventional method for manufacturing FFS mode LCD incurs problems in the aspect of productivity.

Consequently, in order to solve the problems in the productivity, a manufacturing method for FFS mode LCD using the six times of mask processes has been recently proposed.

FIG. 4 is a cross-sectional view for showing a pixel portion in another conventional FFS mode LCD that has been manufactured according to the six times of mask processes, and the manufacturing method thereof will be described hereinafter.

A first transparent insulating substrate 40 is provided. A transparent metal layer such as an ITO is deposited on the substrate 40, and then a counter electrode 41 is formed by patterning the transparent metal layer according to a first mask process. A first opaque metal layer is deposited on a resultant, and then a gate line(not shown), a common electrode line(not shown) and a pad(not shown) are formed by patterning the first opaque metal layer according to a second mask process. A gate insulating layer 42 is formed on the resultant as constructed above.

An a-Si layer and an n+ a-Si layer are deposited in turn on the gate insulating layer 42, an active region of a thin film transistor is defined by patterning the n+ a-Si layer and the a-Si layer according to a third mask process. A second opaque metal layer is deposited on the resultant, and a data line including source and drain electrodes(not shown) is formed by patterning the second opaque metal layer according to a fourth mask process.

A passivation layer 43 is deposited on the entire resultant as constructed above, and then the passivation layer 43 is etched according to a fifth mask process to expose some portions of the pad and the drain electrode. The transparent metal layer such as the ITO is deposited on the passivation layer 43 so that the transparent metal layer is in contact with the exposed pad and the drain electrode. A pixel electrode 44 is formed by patterning the transparent metal layer according to the sixth mask process.

The reference symbols 45 and 55 not yet described in FIG. 4, are the lower alignment layer and the upper alignment layer respectively, and 50 refers to the upper transparent insulating substrate, 60 refers to the liquid crystal layer sandwiched between the substrates, and E1 and E2 are electric fields formed between the counter electrode 41 and the pixel electrode 44.

FIG. 5 is an equivalent circuit diagram illustrating the parasitic resistance and the parasitic capacitance in the electric field forming regions E1, E2. Referring to FIG. 5, the parasitic resistance and the parasitic capacitance (hereinafter referred to as "the parasitic impedance") in the first electric field forming region E1 includes parasitic impedance R45,C45 by the lower alignment layer 45, parasitic impedance R60,C60 by the liquid crystal layer 60, parasitic impedance R45,C45 by the lower alignment layer 45, parasitic impedance R43,C43 by the passivation layer 43 and parasitic impedance R42,C42, and they are serially connected to each other.

The parasitic impedance in the second electric field forming region E2 includes parasitic impedance R43,C43 by the passivation layer 43 and parasitic impedance R42,C42 by the gate insulating layer 42, and they are serially connected to each other.

As described above, the conventional manufacturing method for FFS mode LCD using the six times of mask processes has advantages in manufacturing time and cost by reducing two steps of mask processes, compared to the previous manufacturing method using the eight times of mask process.

However, since the pixel electrode is disposed at the passivation layer, the FFS mode LCD manufactured according to the six times of mask processes has a reduced number of layers existing at the first electric field forming region E1, compared to the number of layers at the FFS mode LCD manufactured according to the eight times of mask processes. As a result, the RC time constant in the FFS mode LCD is rather increased and picture quality thereof is degraded owing to the afterimages. The afterimages are generated when the residue DC is not easily discharged.

That is, the value of RC time constant is calculated by a product of resistance R and capacitance C as shown in the equation 1, and the equivalent capacitance $C_{eq}$ to the serially connected capacitances can be calculated according to the equation 2.

$$\text{Time constant} = R \cdot C \quad \text{equation 1}$$

$$C_{eq} = 1/(1/C_1 + 1/C_2 + 1/C) \quad \text{equation 2}$$

Herein, from the equation 2, it is found that the sum of the capacitances is increased as the number of the serially connected capacitances increases. Accordingly, the decrease in the number of layers existing at the first electric field forming region E1 increases the RC constant, as a result the picture quality of the FFS mode LCD manufactured according to the six times of mask processes is degraded compared to that in the FFS mode LCD manufactured according to the eight times of mask processes, since RC constant is relatively larger.

SUMMARY OF THE INVENTION

Accordingly, the object of the present invention provides a method for manufacturing an FFS mode LCD capable of improving the productivity and picture quality.

To accomplish the foregoing object, a method for manufacturing the FFS mode LCD includes the steps of: depositing a transparent metal layer on a transparent insulating layer and forming a counter electrode by etching the transparent metal layer according to a first mask process; depositing an insulating layer on the counter electrode and the substrate; depositing a first opaque metal layer on the insulating layer and forming a gate line, a common electrode line and a pad by etching the first opaque metal layer according to a second mask process; depositing a gate insulating layer, an a-Si layer and an n+ a-Si layer in turn on a resultant and defining an active region of thin film transistor by etching the n+ a-Si layer and the a-Si layer according to a third mask process; depositing a transparent metal layer on the resultant and forming a pixel electrode of a comb shape by etching the transparent metal layer according to a fourth mask process; etching the gate insulating layer according to a fifth mask process so that the pad is exposed; forming a source electrode, a drain electrode and data line including a data pad by etching the second opaque metal layer according to a sixth mask process; and forming a passivation layer on the entire resultant and etching the passivation layer according to a seventh mask process so that the data pad is exposed.

BRIEF DESCRIPTION OF THE DRAWINGS

The object, aspect and advantages of the present invention will be readily understood with reference to those detailed descriptions and attached drawings.

DETAILED DESCRIPTION OF THE INVENTION

Hereinafter, the description of the preferred embodiment of the present invention will be discussed in detail.

Figure 1:
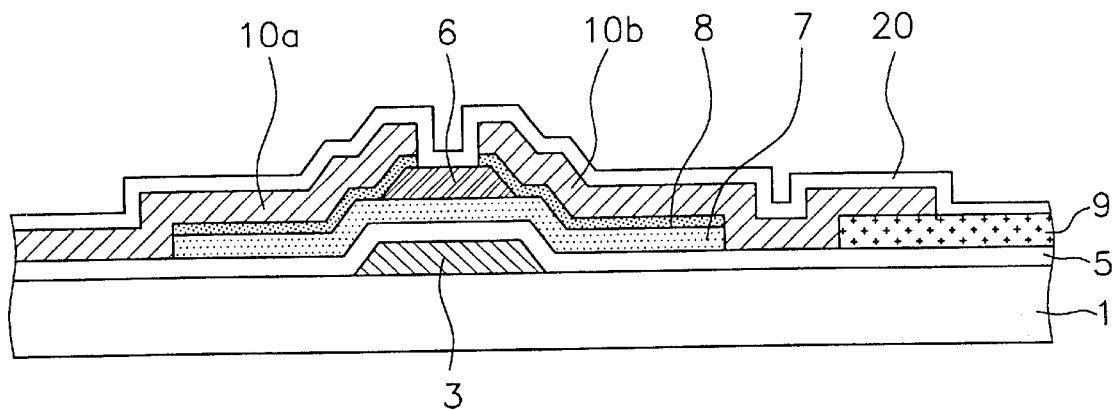
FIG. 1 is a cross-sectional view of a lower substrate of a thin film transistor portion in an FFS mode LCD manufactured according to the conventional eight times of mask processes.
Figure 2:
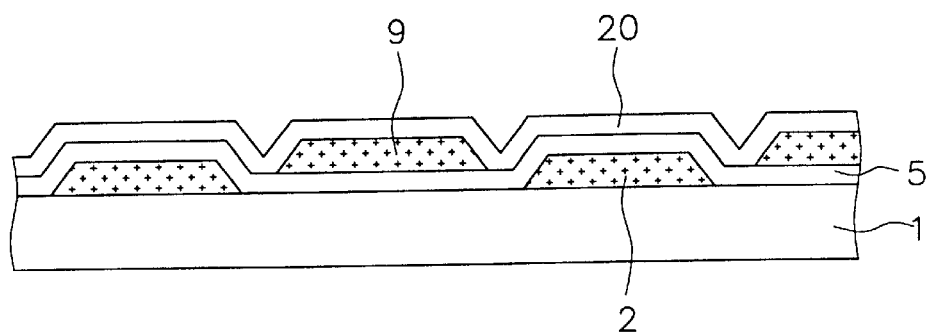
FIG. 2 is a cross-sectional view of a lower substrate of a pixel portion in the FFS mode LCD manufactured according to the conventional eight times of mask processes.
Figure 3:
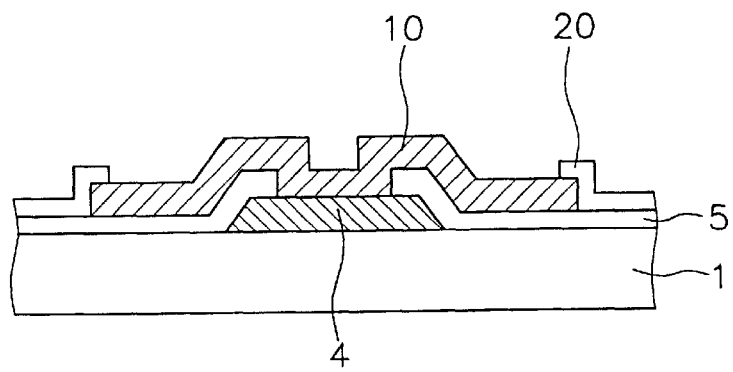
FIG. 3 is a cross-sectional view of a lower substrate of a pad portion in the FES mode LCD manufactured according to the conventional eight times of mask processes.
Figure 4:
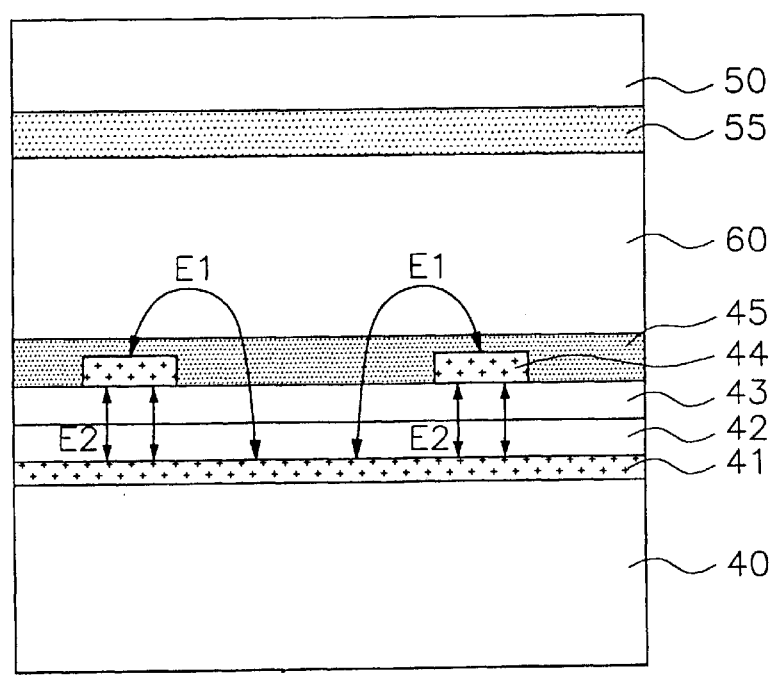
FIG. 4 is a cross-sectional view of an FFS mode LCD manufactured according to the conventional six times of mask processes.
Figure 5:
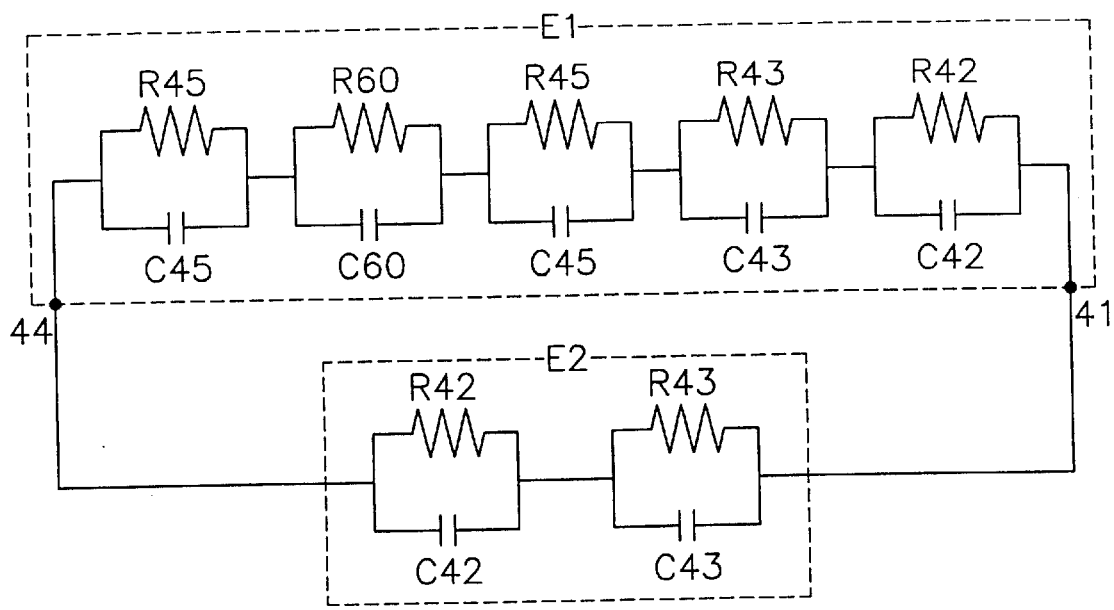
FIG. 5 is an equivalent circuit diagram illustrating parasitic resistance and parasitic capacitance in an electric field forming region of FIG. 4.
Figure 6:
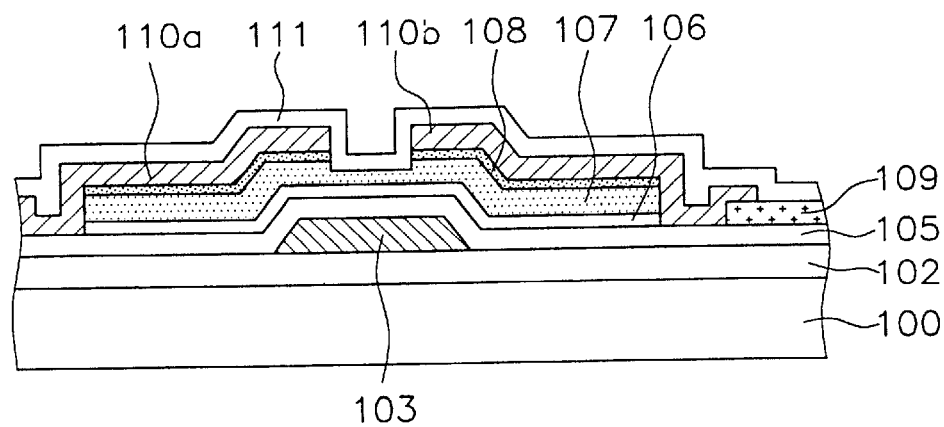
FIG. 6 is a cross-sectional view of a lower substrate of a thin film transistor portion in an FFS mode LCD manufactured according to one embodiment of the present invention.
Figure 7:
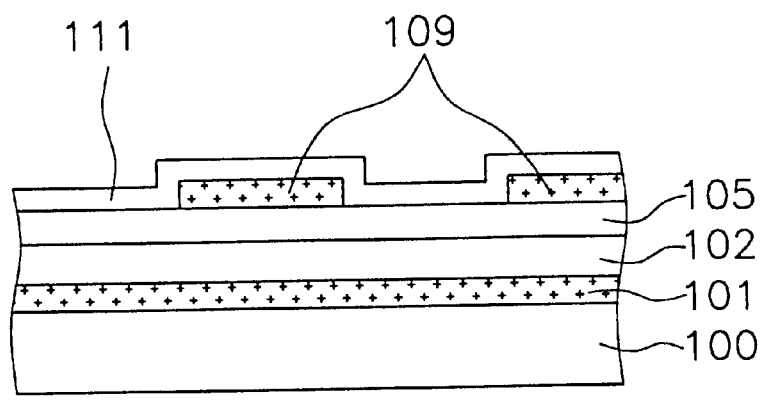
FIG. 7 is a cross-sectional view of a lower substrate of a pixel portion in the FFS mode LCD manufactured according to the embodiment of the present invention.
Figure 8:
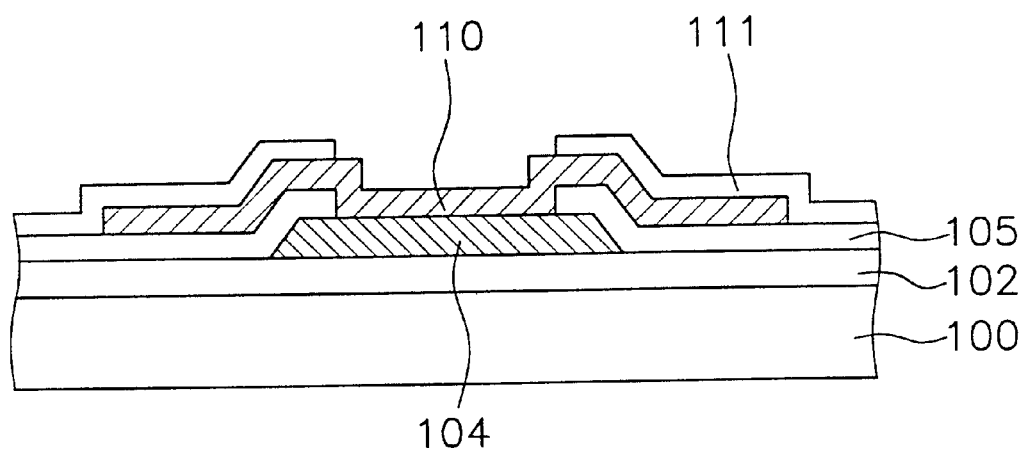
FIG. 8 is a cross-sectional view of a lower substrate of a pad portion in the FFS mode LCD manufactured according to the embodiment of the present invention.

FIGS. 6 to 8 are cross-sectional views for illustrating a method for manufacturing FFS mode LCD according to the embodiment of the present invention. Herein, FIG. 6 is a cross-sectional view of a lower substrate of a thin film transistor, FIG. 7 is a cross-sectional view of a lower substrate of a pixel portion, and FIG. 8 is a cross-sectional view of a lower substrate of a thin film transistor of a pad portion.

A transparent insulating substrate 100 such as a glass substrate is provided. A transparent metal layer, for example an ITO layer is deposited on the substrate 100 by the sputtering method using Ar gas, $O_2$ gas and ITO target. A counter electrode 101 is formed by etching the ITO layer according to a first mask process in shape of a comb or a plate, preferably in shape of the plate. Herein, etching of the ITO layer is preferably performed by the wet etching method using a chemical of HCl, $HNO_3$ and $H_2O$. An insulating layer 102 of $SiO_2$ is deposited on the substrate 100 to cover the counter electrode 101 by the APCVD method using $SiH_4$ gas, $O_2$ gas and $N_2$ gas.

A first opaque metal layer is deposited on the insulating layer 102, and then a gate line 103, a common electrode line(not shown) and a pad 104 are formed by etching the first opaque metal layer according to a second mask process. Herein, the first opaque metal layer is one selected from an MoW layer formed by the sputtering method using Kr or Ar gas and an MoW target, an alloy layer of Al—Nd formed by the sputtering method using Kr or Ar gas and an Al—Nd target, or a stacked layer of Mo/Al formed by the sputtering method using Kr or Ar gas and Mo target and Al target. Further, when the first opaque metal layer is the MoW layer, etching to the MoW layer is preferably performed by the dry etching method using $SF_6$ gas or $CF_4$ and $O_2$ gas. When the first opaque metal layer is the Al—Nd alloy layer or the Mo/Al stacked layer, etching to said layer is preferably performed by the wet etching method using a chemical of $H_3PO_4$, $CH_3COOH$, $HNO_3$ and $H_2O$.

An SiON layer 105, an SiN layer 106, an n+ a-Si layer 108 are successively deposited on the resultant by the PECVD method. An active region of the thin film transistor is defined by etching the n+ a-Si layer 108, the a-Si layer 107 and the SiN layer 106 according to a third mask process. Herein, etching to the deposition layer is preferably performed by the dry etching method using the $SF_6$, He and HCl gas. The SiON layer 105 functions as a gate insulating layer.

A transparent metal layer, for example an ITO layer is deposited on the resultant by the sputtering method, and then a pixel electrode 109 of a comb shape is formed by etching the ITO layer according to a fourth mask process. Herein, the pixel electrode 109 is formed to be overlapped by the counter electrode 101 with intervening the insulating layer 102 and the gate insulating layer 105.

The pad 104 is exposed by etching the portion of the gate insulating layer 105 formed on the pad 104 according to the fifth mask process. Herein, etching to the gate insulating layer 105 is preferably performed by the wet etching method using a BOE solution consisting of HF and $NH_4F$.

A second opaque metal layer is deposited on the resultant as constructed above by the sputtering method, and then source and drain electrodes 110a,110b and a data line including a data pad is formed by etching the second opaque metal layer according to a sixth mask process. Herein, the second opaque metal layer is one selected from an MoW layer formed by the sputtering method using Kr gas or Ar gas and MoW target, or a stacked layer of Mo/Al/Mo formed by the sputtering method using Kr gas or Ar gas and Mo target and Al target. Further, when the second opaque metal layer is the MoW layer, etching to the MoW layer is preferably performed by the dry etching method using $SF_6$ gas or $CF_4$ and $O_2$ gas. When the second opaque metal layer is the stacked layer of Mo/Al/Mo, etching to the second opaque metal layer is preferably performed by the wet etching method using the chemical consisting of $H_3PO_4$, $CH_3COOH$, $HNO_3$ and $H_2O$.

A passivation layer 111 of SiNx is deposited according to the PECVD method over the entire resultant as constructed above. At this time, thickness and material used for the passivation layer 111 should satisfy the following equation 3.

$$(\epsilon/d)_{passivation\ layer} \geq (\epsilon/d)_{gate\ insulating\ layer} \quad (equation\ 3)$$

($\epsilon$:dielectric constant of dielectric, d:thickness)

From the above equation 3, the passivation 111 has preferably a greater the ratio of thickness to dielectric constant than that of the gate insulating layer 105. For example, when the dielectric constant of the gate insulating layer is approximately 4.7 and the thickness thereof is 3,000 Å, the passivation layer 111 is preferably made of a material having dielectric constant of 6.7 and thickness of approximately 5,000–10,000 Å.

Continuously, the pad 104, i.e. the portion of the data line 110 in contact with the pad 104 is exposed by etching the portion of the passivation layer 111 formed on the pad 104 according to a seventh mask process. Herein, etching to the passivation layer 111 is performed by the dry etching method using $SF_6$ gas or $O_2$ gas.

Afterward, although not shown in the drawings, a lower alignment layer is formed on the resultant as constructed above, thereby completing the lower substrate of the FFS mode LCD according to the present invention. Furthermore, the FFS mode LCD is accomplished by attaching the lower substrate and an upper substrate in which an upper alignment layer is formed, with intervening the liquid crystal layer.

In the FFS mode LCD according to the present invention, the passivation layer 111 is formed on the pixel electrode 109, and formed with a large thickness. Accordingly, the RC constant is reduced, compared to the conventional devices, thereby preventing afterimages occurred by the problems in the discharging of residue DC.

More particularly, advantages of the FFS mode LCD according to the present invention will be discussed with reference to FIG. 9 and FIG. 10. Herein, FIG. 9 is a cross-sectional view for showing the FFS mode LCD according to the present invention, and FIG. 10 is an equivalent circuit diagram of parasitic resistance and parasitic capacitance at an electric field forming region.

Figure 9:
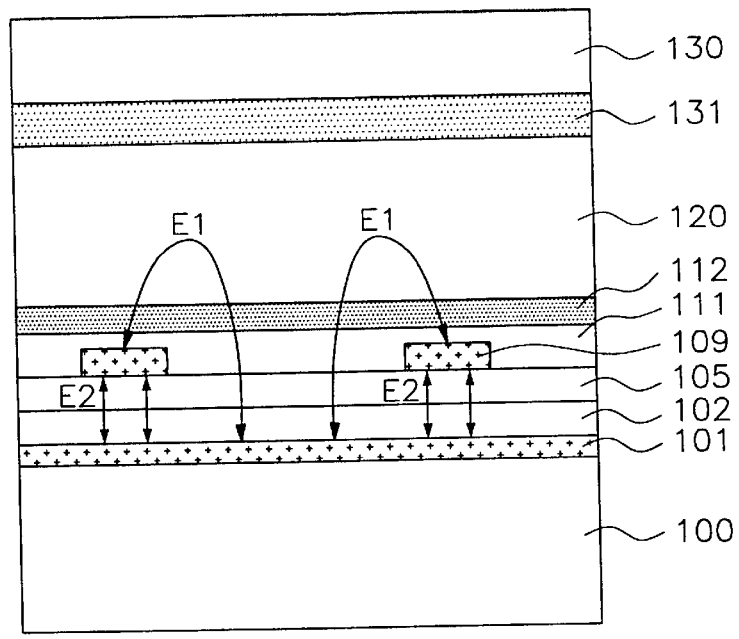
FIG. 9 is a cross-sectional view of a pixel portion of the FFS mode LCD manufactured according to the embodiment of the present invention.

Referring to FIG. 9, as a selected voltage is applied to the counter electrode 101 and the pixel electrode 109, electric fields E1 and E2 are generated between the counter electrode 101 and the pixel electrode 109. At this time, the first electric field E1 is formed as an elliptic form extending for the passivation 109, the lower alignment layer 112, the liquid crystal layer 120, the lower alignment layer 112, the passivation layer 109 and the insulating layers 102,105, and the second electric field E2 is formed in a vertical form. Further, the parasitic impedance consisting of the resistance R and the capacitance C is formed at the electric field forming regions E1, E2. The reference 130 and 131 not yet described stand for an upper transparent insulating substrate and an upper alignment layer respectively.

Figure 10:
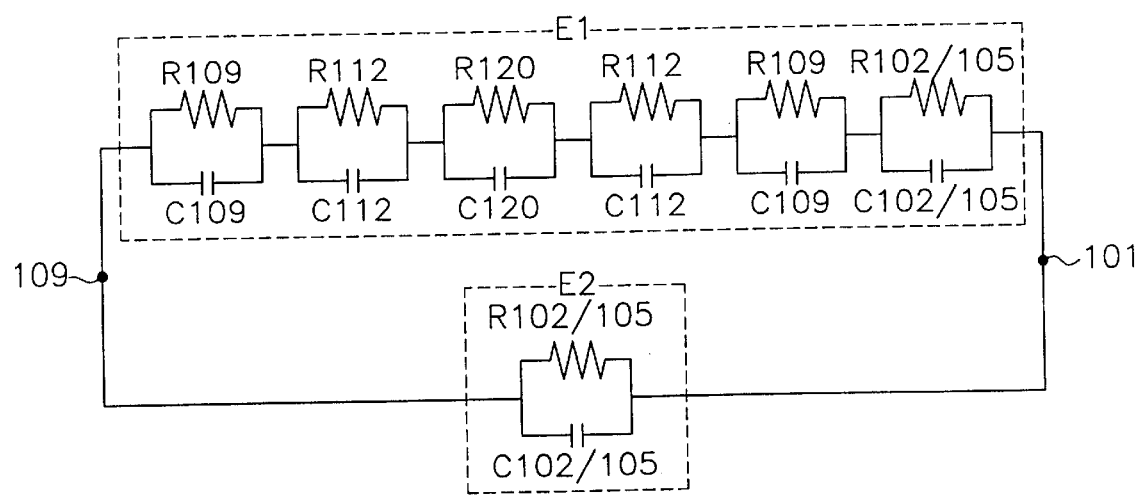
FIG. 10 is an equivalent circuit diagram illustrating parasitic resistance and parasitic capacitance in an electric field forming region of FIG. 9.

Herein, as shown in FIG. 10, the parasitic impedance generated at the first electric field forming region E1 includes an impedance R109, C109 by the passivation layer 109, an impedance R112, C112 by the lower alignment layer 112, an impedance R120, C120 by the liquid crystal layer 120, an impedance R112, C112 by the lower alignment layer 112, an impedance R109, C109 by the passivation layer 109 and an impedance R102/105, C102/105 by the insulating layers 102,105. And, the parasitic impedance generated at the second electric field forming region E2 includes an impedance R102/105, C102/105 by the insulating layers 102,105. Furthermore, the parasitic impedance at each electric field forming region is serially connected to each other.

While comparing FIG. 6 with FIG. 10, a parasitic impedance by the passivation layer 109 is further added to the total impedance at the first electric field forming regions E1 according to the present invention, compared to the conventional total impedance at a first electric field forming region. As known from the equation 2, the equivalent capacitance Ceq of the capacitance decreases as the number of capacitance increases. As a result, since RC time constant is decreased, the residue DC components are easily discharged.

Accordingly, the method for manufacturing the FFS mode LCD according to the present invention using the seven times of mask processes can reduce one time of mask process from the conventional method for manufacturing the FFS mode LCD using the eight times of mask processes, thereby obtaining enhanced productivity.

Furthermore, although the method for manufacturing the FFS mode LCD according to the present invention includes one more mask process than the conventional method using the six times of mask processes, the afterimage problem can be solved by reducing the RC constant thereby improving the picture quality.

Although the preferred embodiment of the present invention has been described and illustrated, various other modifications will be apparent to and can be readily made by those skilled in the art without departing from the scope and spirit of this invention.

What is claimed is:

1. A method for manufacturing a fringe field switching mode liquid crystal display comprising the steps of:
    depositing a transparent metal layer on a transparent insulating layer and forming a counter electrode by etching the transparent metal layer according to a first mask process;
    depositing an insulating layer on the counter electrode and the substrate;
    depositing a first opaque metal layer on the insulating layer and forming a gate line, a common electrode line and a pad by etching the first opaque metal layer according to a second mask process;
    depositing a gate insulating layer, an a-Si layer and an n+ a-Si layer in turn on a resultant and defining an active region of thin film transistor by etching the n+ a-Si layer and the a-Si layer according to a third mask process;
    depositing a transparent metal layer on the resultant and forming a pixel electrode of a comb shape by etching the transparent metal layer according to a fourth mask process;
    etching the gate insulating layer according to a fifth mask processes so that the pad is exposed;
    depositing a second opaque metal layer on the resultant;
    forming a source electrode, a drain electrode and data line including a pad by etching the second opaque metal layer according to a sixth mask process; and forming a passivation layer on the entire resultant and etching the passivation layer according to a seventh mask process so that the data pad is exposed.

2. The method of claim 1, wherein the counter electrode is formed in shape of a comb or a plate.

3. The method of claim 1, wherein the counter electrode and the pixel electrode are made of an ITO layer, and etching to the ITO layer is performed by the wet etching method using HCl, $HNO_3$ or $H_2O$ chemicals.

4. The method of claim 1, wherein the gate insulating layer is made of an SiON/SiN stacked layer.

5. The method of claim 4, wherein the third mask process for defining an active region of thin film transistor is accompanied with etching of the SiN layer.

6. The method of claim 1, wherein the first opaque metal layer is one selected form an MoW layer, an alloy layer of Al—Nd or a stacked layer of Mo/Al.

7. The method of claim 6, wherein when the first opaque metal layer is the MoW layer, etching to the MoW layer is performed by the dry etching method using $SF_6$ gas, $CF_4$ gas and $O_2$ gas.

8. The method of claim 6, wherein when the first opaque metal layer is made of the Al—Nd alloy layer or the Mo/Al stacked layer, etching to said layer is performed by the wet etching method using a chemical of $H_3PO_4$, $CH_3COOH$, $HNO_3$ and $H_2O$.

9. The method of claim 1, wherein the second opaque metal layer is an MoW layer or a stacked layer of Mo/Al/Mo.

10. The method of claim 9, wherein when the second opaque metal layer is the MoW layer, etching to the MoW layer is performed by the dry etching method using SF gas or $CF_4$ and $O_2$ gas, and when the second opaque metal layer is the stacked layer of Mo/Al/Mo, etching to the stacked layer of Mo/Al/Mo is performed by the wet etching method using the chemical consisting of $H_3PO_4$, $CH_3COOH$, $HNO_3$ and $H_2O$.

11. The method of claim 1, wherein the ratio of thickness of the passivation layer to dielectric constant is greater than the ratio of the thickness of the gate insulating layer to dielectric constant.

12. The method of claim 11, wherein the passivation layer is made of SiNx.

13. The method of claim 1, wherein etching to the passivation layer is performed by the dry etching method using $SF_6$ gas or $O_2$ gas.

* * * * *